United States Patent
Chard et al.

(10) Patent No.: US 6,721,937 B2
(45) Date of Patent: Apr. 13, 2004

(54) METHOD AND SYSTEM FOR AUTOMATED PROCESSOR REGISTER INSTANTIATION

(75) Inventors: Gary F. Chard, Richardson, TX (US); Christopher A. Opoczynski, Plano, TX (US); T-Pinn Koh, Plano, TX (US)

(73) Assignee: Fujitsu Network Communications, Inc., Richardson, TX (US)

(*) Notice: Subject to any disclaimer, the term of this patent is extended or adjusted under 35 U.S.C. 154(b) by 0 days.

(21) Appl. No.: 09/875,575

(22) Filed: Jun. 5, 2001

(65) Prior Publication Data

US 2002/0054536 A1 May 9, 2002

Related U.S. Application Data

(60) Provisional application No. 60/210,171, filed on Jun. 6, 2000.

(51) Int. Cl.[7] .............................................. G06F 17/50
(52) U.S. Cl. .................... 716/18; 716/1; 716/3
(58) Field of Search ................. 716/1–21; 257/373, 257/523; 359/118; 365/236; 379/93.25; 709/102, 234; 710/18, 52, 307; 711/219; 712/18, 37, 201, 212; 714/25, 36

(56) References Cited

U.S. PATENT DOCUMENTS

| | | | |
|---|---|---|---|
| 5,541,849 A | | 7/1996 | Rostoker et al. ............ 364/489 |
| 5,752,035 A | * | 5/1998 | Trimberger ................. 717/153 |
| 5,867,400 A | * | 2/1999 | El-Ghoroury et al. ......... 716/1 |
| 5,896,521 A | | 4/1999 | Shackleford et al. ....... 395/500 |
| 6,216,252 B1 | * | 4/2001 | Dangelo et al. ............... 716/1 |
| 6,298,370 B1 | * | 10/2001 | Tang et al. ................. 709/102 |
| 6,519,756 B1 | * | 2/2003 | Kao et al. .................... 716/18 |

FOREIGN PATENT DOCUMENTS

EP    0 645 723 A2    3/1995    .......... G06F/17/50

OTHER PUBLICATIONS

Halliday et al., "Test design compilers complement top down ASIC design", Sep. 20–23, 1993, AUTOTESTCON '93. IEEE Systems Readiness Technology Conference. Proceedings, Page(s): 513–519.*

Wunnava et al., Correlating software modelling and hardware responses for VHDL and Verilog based designs, Mar. 25–28, 1999.*

International Search Report dated Jun. 4, 2003 for PCT/US01/40854 (5 pages).

(List continued on next page.)

Primary Examiner—Vuthe Siek
Assistant Examiner—Helen Rossoshek
(74) Attorney, Agent, or Firm—Baker Botts L.L.P.

(57) ABSTRACT

The invention includes an automated method for instantiation of a plurality of registers within an integrated circuit or integrated circuit device, including the computer-implemented steps of defining a programming language having a plurality of keywords identified with the plurality of registers, creating a control file describing the plurality of registers using the defined programming language, providing a compiling program compatible with the control file, and executing the compiling program to generate from the control file a first set of synthesizable codes containing information on traits of each of the registers. Preferably, the synthesizable codes include RTL codes. In a further embodiment, the invention includes executing the compiler program for generating an address decoder module operative n conjunction with the first set of synthesizable code through a top-level module for instantiation of the address decoder module and the plurality of registers.

25 Claims, 10 Drawing Sheets

OTHER PUBLICATIONS

Nels Vander Zanden, "Synthesis of Memories From Behavioral HDSLs," XP-10140521A, *IEEE*, Apr. 1994, 4 pages.

J. M. Saul, "Hardware/Software Codesign for FPGA-Based Systems," XP-002138152, *IEEE*, Proceedings of the 32nd Hawaii International Conference on System Sciences, Mar. 1999, 10 pages.

Jin-Hyuk Yang et al., "MetaCore: An Application-Specific Programmable DSP Development System," XP-000923925, *IEEE Transactions on Very Large Scale Integration (VLSI) Systems*, vol. 8, No. 2, Apr. 2000, 11 pages.

PCT International Search Report in International Application No. PCT/US 01/40854, dated Sep. 16, 2002, 5 pages.

* cited by examiner

METHOD AND SYSTEM FOR AUTOMATED PROCESSOR REGISTER INSTANTIATION This application claims priority from Provisional Application No. 60/210,171, filed Jun. 6, 2000.

The present invention relates generally to methods and systems, including computer programs and computer-programmed devices, for automatically generating processor register block Register Transfer Language ("RTL") modules for automatic instantiation of an integrated circuit ("IC") or related device. The invention allows processor blocks to be created easily and consistently for each of the major blocks of an IC device design.

BACKGROUND OF THE INVENTION

Integrated circuit devices contain a large plurality of registers. As is known in the art, a data register within an IC device is one of a small set of data holding places that are part of a computer microprocessor and that provide a place for passing data from one instruction to the next sequential instruction or to another program that the operating system has just given control to. A register must be large enough to hold an instruction—for example, in a 32-bit instruction computer, a register must be 32 bits in length. In some IC designs, there are smaller registers—for example, half-registers—for shorter instructions. Depending on the processor design and language rules, registers may be numbered or have arbitrary names.

Processor registers must in general be instantiated before operational use. An "instance" is a particular realization of an abstraction or such as a class of object or a computer process. To instantiate is to create such an instance by, for example, defining one particular variation of object within a class, giving it a name, and locating it in some physical place. In terms of IC registers, instantiation is generally known to consist of providing for a particular register within an IC a given state.

Register transfer language describes what happens in a computer, literally among registers, when specific conditions are met. For instance, an RTL expression such as:

$$a'b: R2 \leftarrow R3 + R1$$

means if a'b==1 then add the contents of R3 and R1 and store in register R2 where a and b are control signals. The discussion within this disclosure assumes a level of general familiarity with RTL expressions and coding structures.

In the prior art, it has of course been known that it is advantageous and necessary to instantiate a number (often a large plurality) of registers within an IC or IC device to prepare it for computational usage in accordance with its intended function. There are generally thousands, or even many thousands, of registers within an IC. In the prior art, coding or instantiation of proper register values for each of these registers had to be performed manually. Such a process is laborious, and introduces a risk of inconsistent or erroneous instantiation of values, in addition to being unduly costly. Additionally, customizing new register maps (i.e., new sets of particular combinations of instantiated states for particular registers) has been laborious, thus perhaps discouraging maximally-adaptable customization of register states useful for particular IC designs or functions. Further, manual instantiation of registers has not, it is believed, always been associated with maximally-efficient localizing of registers and register groupings within IC architecture, which has led in some cases to lengthened bus paths within the IC, thus possibly giving rise to time lags for IC processing as well as related timing problems. Further, multiple departments or fabricating personnel for an IC design may not, in the cases in which manual instantiation has been used, always been readily able to ensure the consistency and uniformity of the manually-instantiated register values for all registers within an IC design.

Thus, it would be desirable to provide an automated system and method for instantiation of IC chips. It would further be desirable to provide for readily-implemented computerized application of such automated method. It would likewise be desirable to provide for a method of consistent register instantiation, even when multiple chip developers or workstations are involved in development or instantiation of a given IC. It would further be desirable to provide a method of IC instantiation conducing to ready customization of IC registers and a variety of different register states for different functional purposes. It would still further be desirable to provide such a method in a fashion that would enable localizing of registers and associated groups of registers to shorten bus paths and reduce IC timing problems. It would also be desirable to provide such a method in connection with a readily-available, extensible programming language, such as RTL. It would still further be desirable to provide such a method in a fashion substantial universal and adaptable to processing systems for instantiation that are capable of processing text files. The prior art is not believed to meet these needs.

SUMMARY OF THE INVENTION

The present invention includes an automated method for instantiation of a plurality of registers within an integrated circuit or integrated circuit device, including the steps of defining a programming language having a plurality of keywords identified with the plurality of registers, creating a control file describing the plurality of registers using the defined programming language, providing a compiling program compatible with the control file, and executing the compiling program to generate from the control file a first set of synthesizable codes containing information on traits of each of the registers. Preferably, the synthesizable codes include RTL codes. In a further embodiment, the invention includes executing the compiler program for generating an address decoder module operative n conjunction with the first set of synthesizable code through a top-level module for instantiation of the address decoder module and the plurality of registers.

The present invention makes available an automated system and method for computer-implemented instantiation of IC chips. The invention also makes possible of consistent register instantiation, even when multiple chip developers or workstations are involved in development or instantiation of a given IC. The methods disclosed herein are useful for ready customization of IC registers and a variety of different register states for different functional purposes. The present invention further enables improved localizing of registers and associated groups of registers to shorten bus paths and reduce IC timing problems. Also disclosed herein are embodiments of the present invention implemented in connection with a readily-available, extensible programming language, such as RTL. The compatibility of RTL with processing systems capable of processing text files makes the RTL-utilizing embodiment of the present invention particularly useful. The disclosure herein is drawn principally to such RTL embodiments, and the methods and examples detailed hereinbelow will be readily understood and adaptable by those skilled in the art of IC register design and RTL coding.

Such methods conduce to a substantial universal and adaptable methods for instantiation that are capable with many types of method-implementing instantiating computers capable of processing text files.

DETAILED DESCRIPTION OF THE PREFERRED EMBODIMENTS

Figure 1:
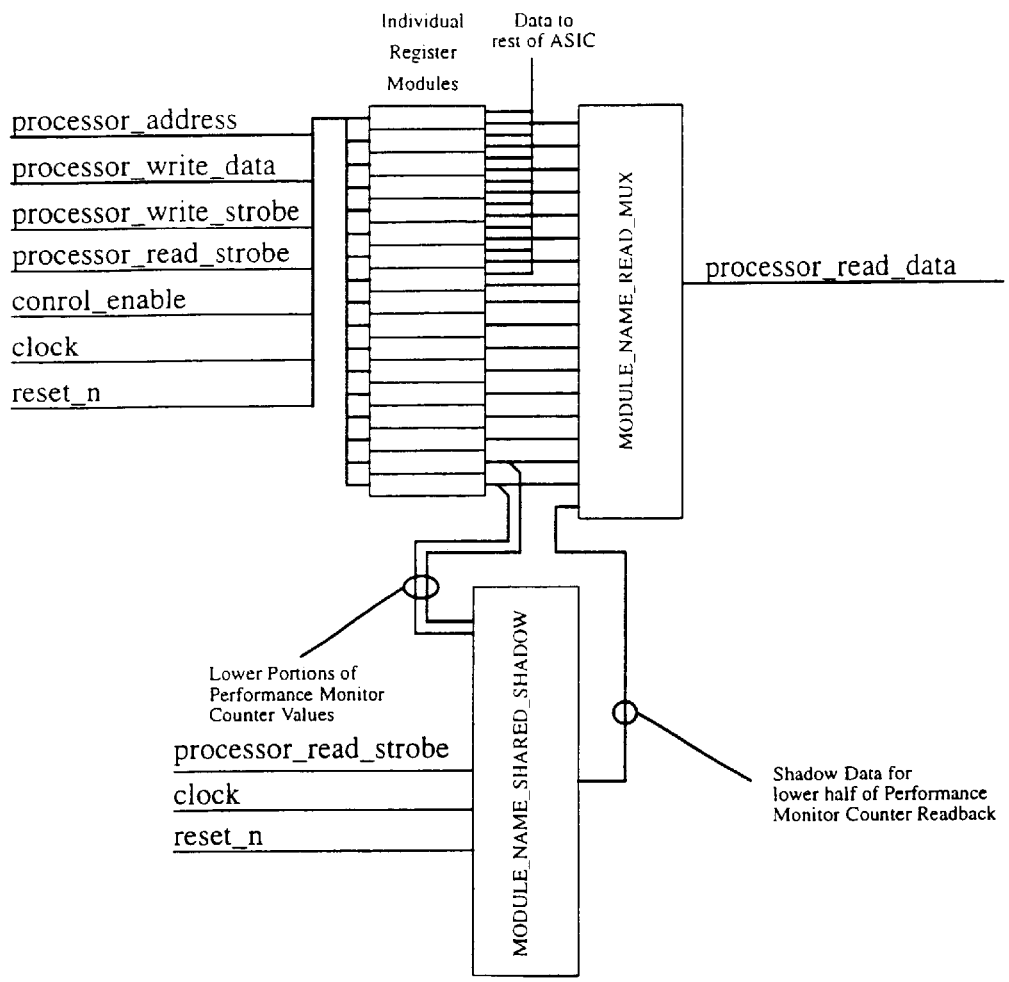
FIG. 1 displays the architecture for the created MODULE_NAME module employed in the present invention.

The present invention provides support for variable width processor address and data bus. It further provides support for at least the following register types:

Read Only (Dynamic Hardware Status and Hardcoded Values)

Read/Write

Performance Monitor Counter (1<counter width≦2×data bus width)

Interrupt Status/Mask/Force/Raw

Smart Bit (As defined in the Flash 150 and 600 ADX programs)

Clear On Read Status

The invention can also be configured to provide support for Flexible module and internal clock signal names; support for signals not leaving the processor register block explicitly to be eliminated from the created module port list; support for shared and non-shared shadow registers for counters larger than the processor data bus width; support for selectively enabling/disabling writes to certain registers in the created module depending upon a control_enable input signal; support for flexible default register value assignment (register value after hard reset); support for registers with partial bits of a register type implemented; support for shared and non-shared read holding register for register types requiring a holding function: Performance Monitor Counter, Clear on Read Status; extensive error trapping during control file processing; support for verification of data in global definitions file; support for connection of custom RTL modules without modifying the top level module; and support for verilog style comments in the control file.

As currently practiced, the preferred embodiments of the present invention also have some limitations that should be noted (although some of these limitations may be susceptible of being overcome by adaptations evident to those of ordinary skill in the art, and should not be considered to be absolute limitations). Some constraints on the preferred embodiments of the invention include:

Each register address may generally only use one of the allowed register types. Mixing register types per address location is not currently supported.

Register bit populations that are not right justified to the 1sb may contain extra hardware. For example, a sixteen bit register with a read/write bit only in the msb and lsb positions will require the entire register to be populated with actual hardware registers. However, for example, it is acceptable to only place bits in the bottom 4 bit positions of a 16 bit data_bus width. Only 4 registers will be populated in the instantiated module, and the unused bit positions will always read back zero (0).

All register addresses should be in the form of 'defines and be placed in the global definitions file specified in the control file.

The present invention is preferably implemented in conjunction with a plurality of interoperative software modules, including purpose-created modules (although, as is known, essentially any algorithm implementable by software is also implementable by firmware, etc.). Those of ordinary skill in the art will understand that a variety of programming algorithms may be readily adapted for implementation of the modules useful for practicing the present invention. The modules contemplated in conjunction with the preferred implementations of the present invention for instantiating a plurality of registers in desired fashion are briefly described hereinbelow, and may further be understood by reference to the appended Figures. The first module described is a top level input/output ("I/O") coordinating module for interface purposes.

Created Top Level Module I/O

TABLE 1

Created Top Level Module I/O Interface

| Signal Name | I/O | Width* | Function |
|---|---|---|---|
| processor_read_data | O | data-bus_width | Processor Read Data. The read data will be held static by this module until the next read cycle and ready for sampling as early as one rising clock edge after the edge where processor_read_strobe is sampled asserted. |

TABLE 1-continued

Created Top Level Module I/O Interface

| Signal Name | I/O | Width* | Function |
| --- | --- | --- | --- |
| processor_address | I | address_bus_width | Processor Address. This is the address intended for use during both write and read cycles, to allow determination of the register which the processor interface intends to access. This signal must be input synchronously with clock. |
| processor_write_data | I | data_bus_width | Processor Write Data. This is the data intended for use during a write to a register from the processor interface. This signal must be input synchronously with clock. |
| processor_write_strobe | I | 1 | Processor Write Strobe. This indicates valid data is currently on processor_write_data and a valid address is currently on processor_address. This signal must be input synchronously with clock. |
| processor_read_strobe | I | 1 | Processor Read Strobe. This indicates a read cycle is requested at the processor interface. This signal indicates valid data is currently on processor_address. This signal must be input synchronously with clock. |
| control_enable | I | 1 | This signal, when asserted on the same edge as processor_write_strobe, will prevent the write cycle to certain registers identified in the Input Control File. This signal must be input synchronously with clock. |
| clock | I | 1 | Synchronous Periodic Clock |
| reset_n | I | 1 | Asynchronous Low True Reset |

*= Indicates signal width is variable depending upon the application, and can be configured in the Input Control File.

The processor_read_data time will be ready for sampling on the rising edge after processor_read_strobe is sampled asserted. This delay is best case, and assumes the read mux is small. In cases where many registers are implemented in one block, the delay may take several clocks, and is dependent upon the combinatorial delay on the read mux.

It should be noted that there will be other I/O to and from the module which are required to support the various register types. These other I/O signals will go directly to or from the hardware logic inside the Application Specific Integrated Circuit ("ASIC" or "asic") (outside the created module). It will become evident from the individual module definitions below which signals will need to cross the MODULE_NAME module boundary.

High Level Architecture

This program creates a top level module called MODULE_NAME (the module name may be specified in the control file). Inside this top level module, there will be a generic module automatically instantiated for each of the registers defined in the Control File Input. There will also be a MODULE_NAME_READ_MUX module instantiated which logically reviews all the data from all the registers, and latches any registers configured for a shared latching structure. There is another module called MODULE_NAME_SHARED_SHADOW which will provide the latching function for each of the Performance Monitor Counters which have a counter width greater than 1× the data_bus_width. This MODULE_NAME_SHARED_SHADOW module will only be present if the user has selected performance monitor counter registers with shared shadow registers in the Input Control File. All of the modules instantiated in the top level module will not require any modification by the user.

CREATED MODULE_NAME Module Architecture

Several modules are created on a purpose-initiated basis.

FIG. 1 illustrates the created MODULE_NAME module architecture.

Figure 2:
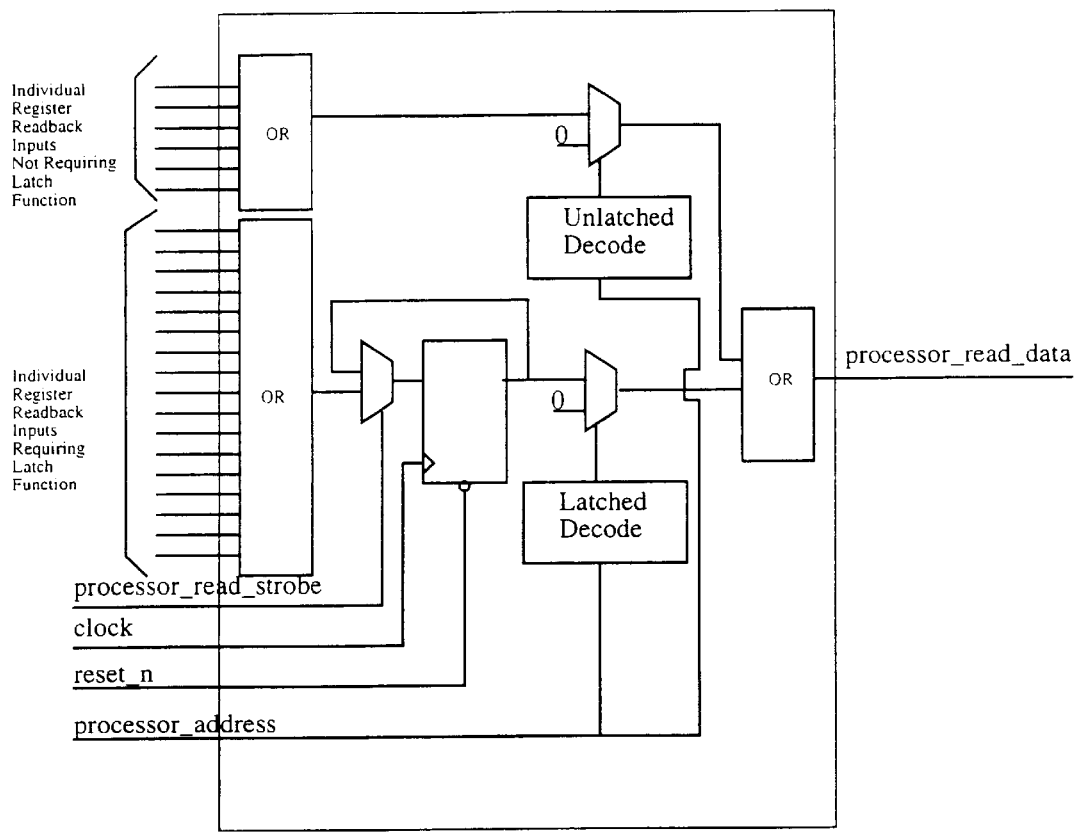
FIG. 2 displays the architecture for the created MODULE_NAME_READ_MUX module employed in the present invention.

FIG. 2 illustrates the created MODULE_NAME_READ_MUX module architecture.

Figure 3:
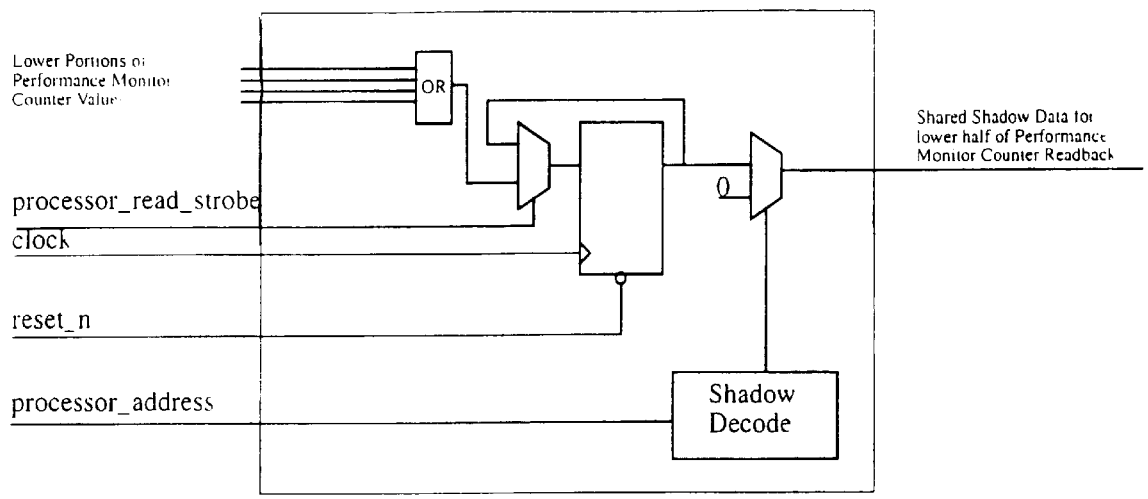
FIG. 3 displays the architecture for the created MODULE_NAME_SHARED_SHADOW module employed in the present invention.

FIG. 3 illustrates the created MODULE_NAME_SHARED_SHADOW module architecture.

Detailed Register Type Definition

The following disclosure describes the details of the implementation for each of the allowed register types. Any restrictions on their usage is also noted.

Currently Available Register Types include:
Read Only (Dynamic Hardware Status and Hardcoded Values) (one Version of the instantiated module)
Read/Write (one Version of the instantiated module)
Performance Monitor Counter (1<counter width<2×data bus width) (four Versions of the instantiated module, two with and two without the shared latch/and shared shadow configuration)
Interrupt Status/Mask/Force/Raw (one Version of the instantiated module)
Smart Bit (as defined in the Flash 150 and 600 ADX programs) (one Version of the instantiated module)
Clear On Read Status (two Versions of the instantiated module, one with and one without the shared latch function)

There are two reasons why multiple versions of some modules are preferred; both reasons are related to the combinations of high/low performance/area points. Firstly, using shared performance monitor counter shadow registers will save area, but potentially complicate timing. For area sensitive, lower speed designs this mode will be optimal. For higher speed designs which are not area critical, the non-shared performance monitor counter shadow register mode may prove more advantageous. This mode is set per register defined in the Input Control File. Of course, a hybrid solution is possible through user register type selection flexibility.

Secondly, the Performance Monitor Counter, and Clear on Read Status register types require a latching function during the read cycle. This is due to the fact that the read cycle itself modifies the data contained in these registers such that the value to be read must be stored separately from the actual current register value. Once again, for designs where area does not matter greatly but speed does, it is more optimal to use a non-shared latch mode. For area sensitive, lower speed designs a shared latching mode may prove more advantageous.

It will also be possible to exchange one mode with another, and not have a significant negative impact on the device at or above the created MODULE_NAME instantiation level in the ASIC. This facilitates change at a later time if the initial choice of area-vs-performance is incorrect.

Read Only Module Definition (Read_Only_Reg)

Figure 4:
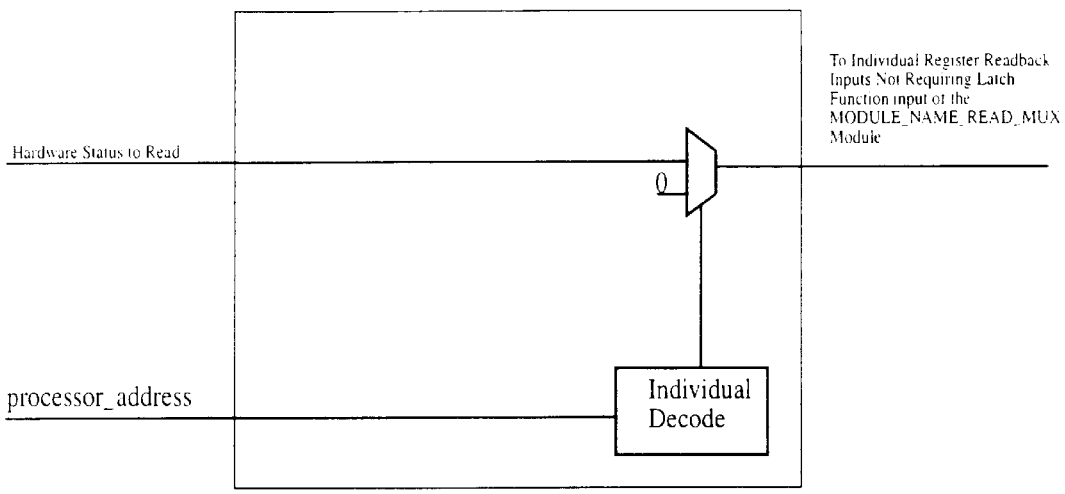
FIG. 4 displays the architecture for the created READ_ONLY_REG module employed in the present invention.

FIG. 4 illustrates the READ_ONLY_REG module architecture. The read data from this module does not require further latching with the processor_read_strobe.

Read/Write Module Definition (Read_Write_Reg)

Figure 5:
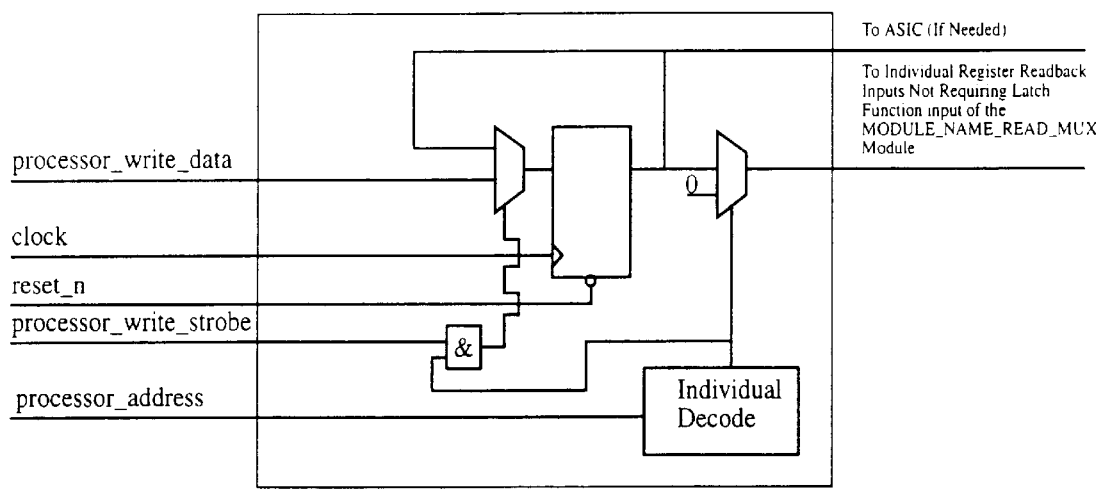
FIG. 5 displays the architecture for the created READ_WRITE_REG module employed in the present invention.

FIG. 5 illustrates the READ_WRITE_REG module definition. The read data from this module does not require further latching with the processor_read_strobe.

Performance Monitor Counter Definition (PM_Counter_Reg) (Version 1)

Figure 6:
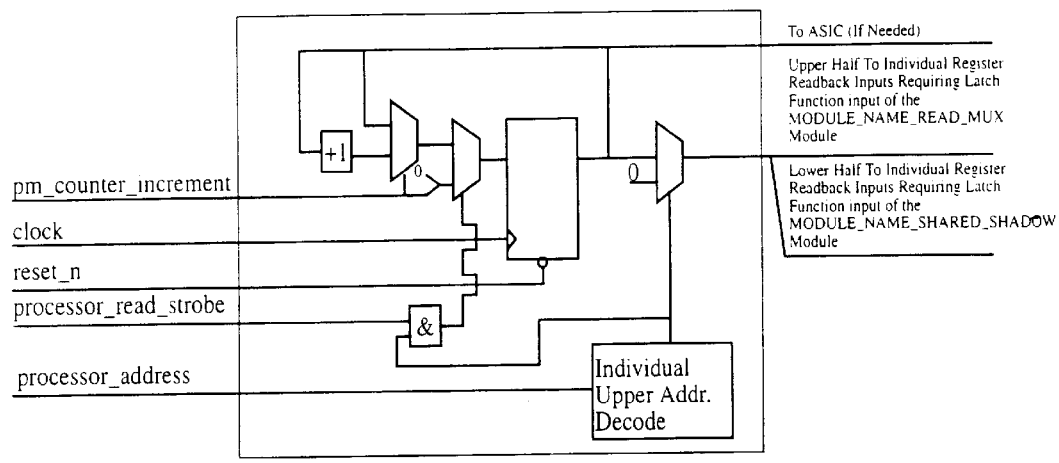
FIG. 6 displays a first version (Version 1) of the architecture for the PM_COUNTER_REG module employed in the present invention.

FIG. 6 illustrates the PM_COUNTER_REG module architecture in a first version (Version 1). The read data from this module does require further latching with the processor_read_strobe.

Performance Monitor Counter Definition (PM_Counter_Reg) (Version 2)

Figure 7:
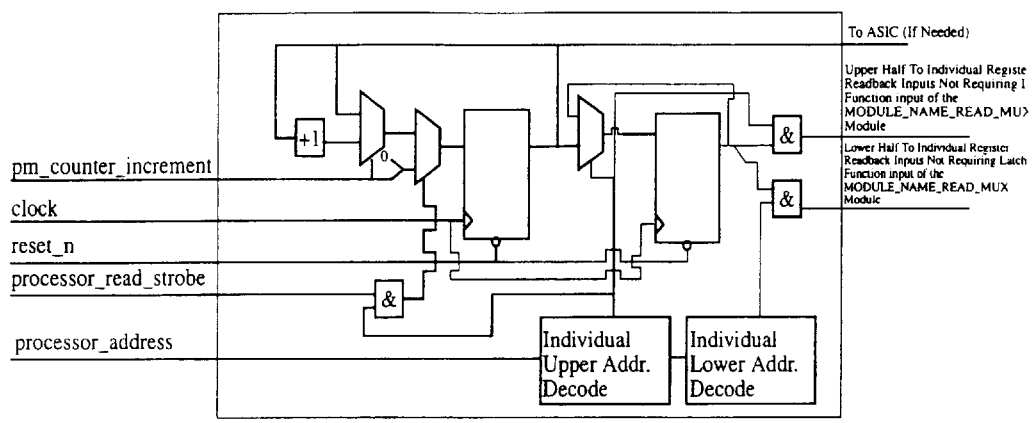
FIG. 7 displays a first version (Version 2) of the architecture for the PM_COUNTER_REG module employed in the present invention.

FIG. 7 illustrates the PM_COUNTER_REG module architecture in a second version (Version 2). The read data from this module does not require further latching with the processor_read_strobe.

Interrupt Status/Mask/Force/Raw (Interrupt_Status_Mask_Force_Reg)

Figure 8:
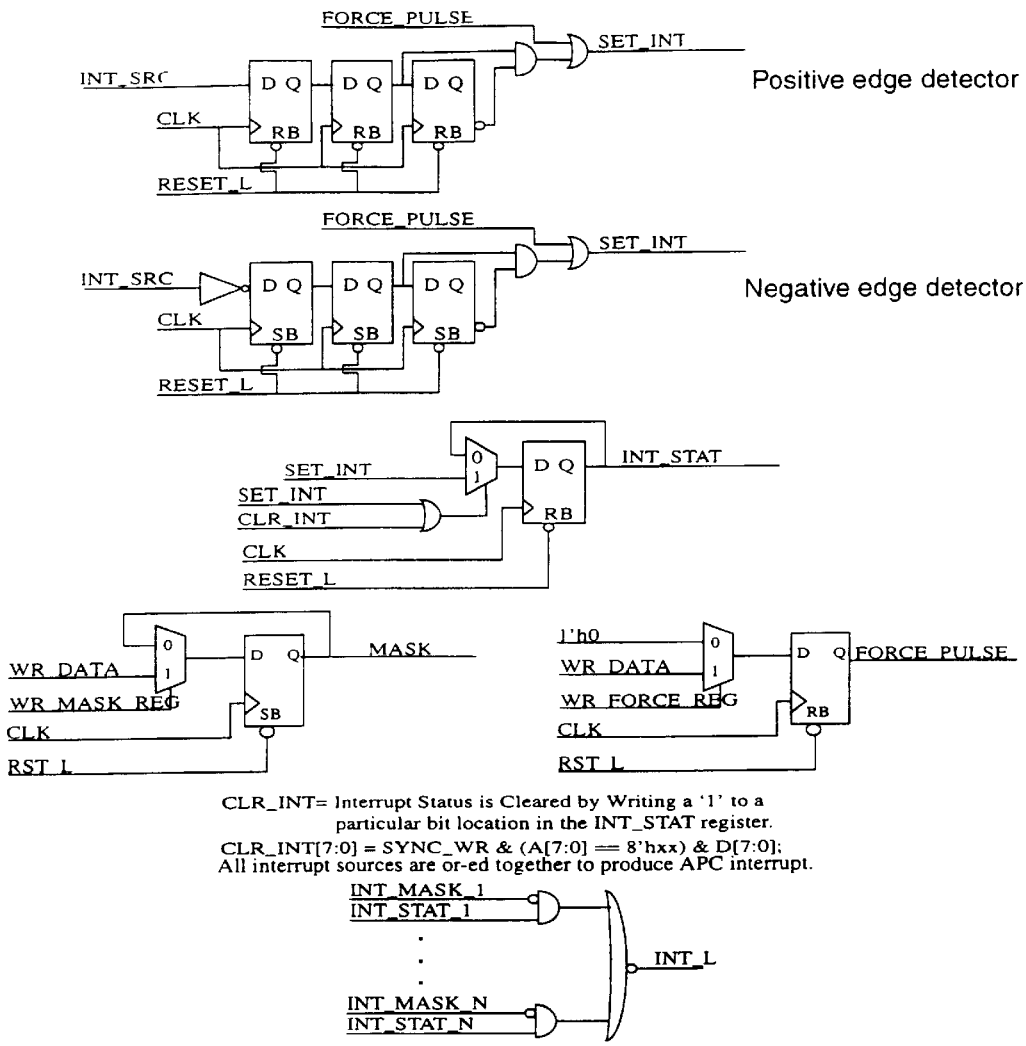
FIG. 8 displays the architecture for the Interrupt_STATUS_MASK_FORCE_REG module employed in the present invention.

FIG. 8 illustrates the INTERRUPT_STATUS_MASK_FORCE_REG module architecture. The read data from this module does not require further latching with the processor_read_strobe.

The invention preferably includes an interrupt handler configured for register analysis in connection with an instantiation process and interrupts. Table 2 sets forth certain exemplary register definitions for the interrupt handler.

TABLE 2

Interrupt Handler Register Definitions

| Register Name | R/W | Default Value | Description |
| --- | --- | --- | --- |
| Interrupt Status | R/W | N/A | These bits indicate an interrupt condition has occurred either on a given interrupt source line or as a result of writing a one to a particular bit location in the Interrupt Force Register. Writing a one to a particular bit location in this register clears the stored interrupt condition of either source. If necessary, the source causing this interrupt bit to be set should also be cleared (unless the Interrupt Force Register caused the bit to be set). Reading this register location returns the state of each of the stored interrupt status bits. |
| Interrupt Mask | R/W | All 1's | These bits, when set, prevent the corresponding bit in the Interrupt Status Register from asserting the composite chip level interrupt output to the processor. Reading this register location returns the current status of the Interrupt Mask Bits. |
| Raw Interrupt Source | R | N/A | These read only bits represent the current state of the raw interrupt source lines. These bits are guaranteed not to be dynamic during the processor read cycle since all data is latched after the processor read data mux with the read strobe from the processor. |
| Interrupt Force | W | All 0's | These write only bits allow the forced setting of the Interrupt Status Register bits when a one is written to a particular bit location. Writing a zero to an individual bit location does nothing. This register location shall always read back all zero's. The composite chip level interrupt output is asserted depending solely upon the value of the Interrupt Status Register and the Interrupt Mask Register. As previously mentioned, the corresponding Status Register bit is automatically set |

TABLE 2-continued

Interrupt Handler Register Definitions

| Register Name | R/W | Default Value | Description |
|---|---|---|---|
| | | | when a one is written to a bit at this register location. It is never necessary to write a zero to these register bit locations to clear a previous write of a one since only a pulse is created inside the ASIC (i.e. no data storage occurs). |

Smart Bit (Smart_Bit_Reg) Module

A Smart Bit Module is supplied. The read data from this module does not require further latching with the processor_read_strobe.

Smart Bit Truth Table and Schematic:

| | |
|---|---|
| SW_CUR | Current Software Sample Value. |
| SW_LAST | Last Software Sample Value. |
| HW_DEFECT | Current Hardware Defect Value. |
| HW_TOGGLE 1 | Hardware Defect Toggled, 0 - Hardware Defect Unchanged |

| HW_DEFECT | HW_TOGGLE | SW_LAST | SW_CUR |
|---|---|---|---|
| 0 | 0 | 0 | 0 |
| 0 | 0 | 1 | 0 |
| 0 | 1 | 0 | 1 |
| 0 | 1 | 1 | 0 |
| 1 | 0 | 0 | 1 |
| 1 | 0 | 1 | 1 |
| 1 | 1 | 0 | 1 |
| 1 | 1 | 1 | 0 |

Clear On Read Status (Clear_On_Read_Reg) (Version 1)

Figure 9:
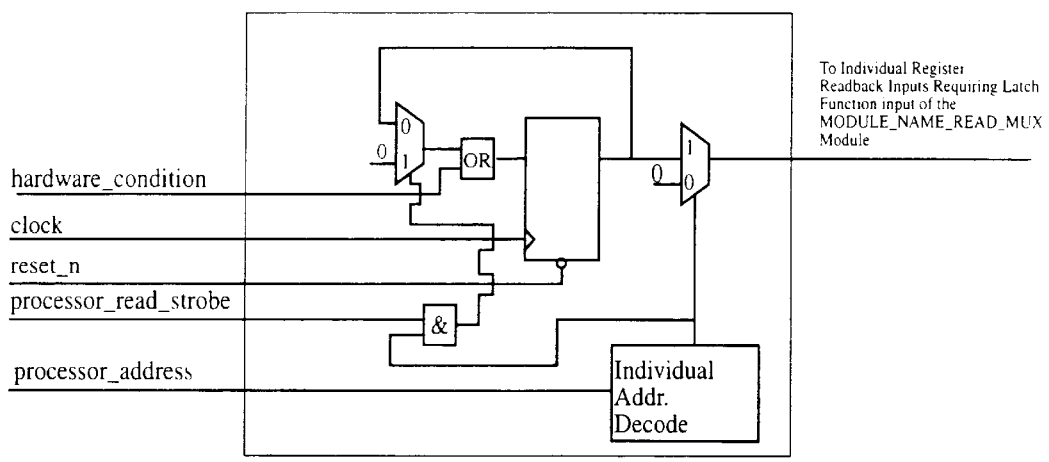
FIG. 9 displays a first version (Version 1) of the architecture for the CLEAR_ON_READ_REG module employed in the present invention.

FIG. 9 illustrates the CLEAR_ON_READ_REG module architecture in a first version (Version 1). The read data from this module does require further latching with the processor_read_strobe.

Clear On Read Status (Clear_On_Read_Reg) (Version 2)

Figure 10:
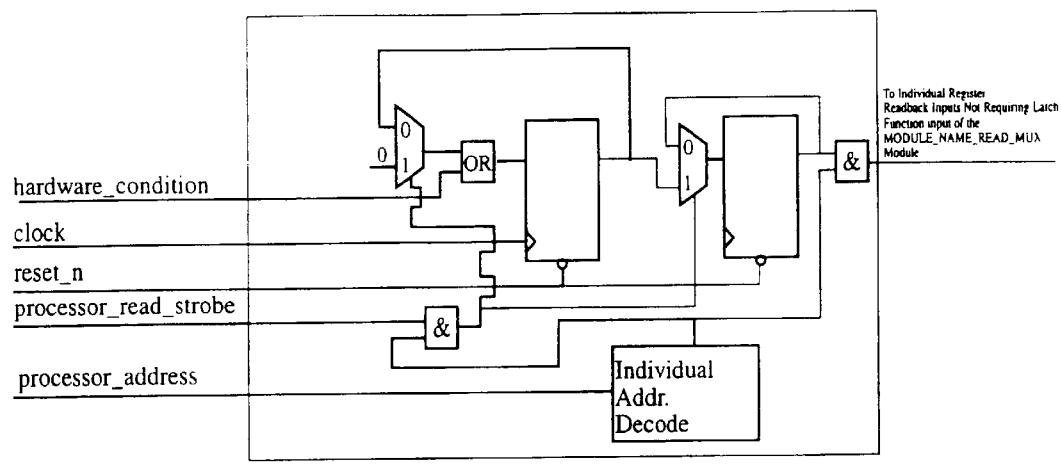
FIG. 10 displays a second version (Version 2) of the architecture for the CLEAR_ON_READ_REG module employed in the present invention.

FIG. 10 illustrates the CLEAR_ON_READ_REG module architecture in a second version (Version 2). The read data from this module does not require further latching with the processor_read_strobe.

Control File Input Format

Certain exemplary formats for control file input are set forth below:

```
Standard RCS Header (This file should be treated as a source file).
MODULE_NAME=WHATEVER_YOU_WANT_TO_CALL_THIS_MODULE
CLOCK_NAME=whatever you want_to_call_your_clock
STANDARD_INCLUDE_NAME=whatever_module_name_to_be_included
DATA_BUS_WIDTH=width of the data bus (read width=write width)
ADDRESS_BUS_WIDTH=width of the address bus
READ_ONLY_REG
        16
        'ADDR_DEFINE
        {input signal list}
READ_WRITE_REG
        16
        'ADDR_DEFINE
        'REG_DEFAULT
        {output signal list} -     optional
        LWCE -                     optional
PM_COUNTER_REG
        32
        'UPPER_ADDR_DEFINE
        'LOWER_ADDR_DEFINE - optional (only if reg width>data_bus_width)
        'REG_DEFAULT
        {input_pulse}
        {output_signal_name} -     optional
        SLM - optional
INTERRUPT_STATUS_REG
        16
        'ADR_DEFINE_STAT
        'ADDR_DEFINE_MASK
        'ADDR_DEFINE_FORCE
        'ADDR_DEFINE_RAW
        {input signal list}
        LWCE -                     optional
SMART_BIT_REG
        16
        'ADDR_DEFINE
        {input signal list}
```

-continued

```
CLEAR_ON_READ_REG
        16
        'ADDR_DEFINE
        {input signal list}
        SLM -              optional
```

Addresses

All addresses should be passed to the program as 'defines which are fully specified in the global definitions file. The full path to this file should be specified in the control file.

Input Signal/Output Signal Format

{name: size, name[n:0] . . . } if the size is omitted the program will default to 1 bit wide signals for example the statement:

{input 1, input2, input_bus1:[3:0}, input_bus2[9:0]} would translate to:

```
wire                input 1
wire                input 2
wire    [3:0]       input_bus1
wire    [9:0]       input_bus2
```

Register Default Format

If a default value is required for a register, the user can specify this value as a 'define, a hard coded value or use the "< >" token in order to use the default clear of all 0's.

Example Input Control File

Below is provided an exemplary form of input control file.

```
//
//FUJITSU NETWORK COMMUNICATIONS Proprietary and Confidential Information//
//$Header:$
//Module: SAMPLE.DAT
//Author: Chris Opoczynski
//Date: 08/18/99
//Description:
//      Sample control file template
//$Log:$
//
//Control file header data bus 16 bits address bust 8 bits
MODULE_NAME=SAMP
CLOCK_NAME=generic_clock
STANDARD_INCLUDE_NAME=sample_def.v
DATA_BUS_WIDTH=16
ADDRESS_BUS_WIDTH=8
//Read only register 8 bits at address 'def1, input signal in 1
READ_ONLY_REG
        8
        'def1
        {IN1[7:0]}
//Read/write register 8 bits at address 'def2, default clear, ouput signal in2
READ_WRITE_REG
        8
        'def2
        <>
        {in2[7:0]}
//Clear on read register with shared holding register 16 bits at address 'def3.,
//input signal in3
CLEAR_ON_READ_REG
        16
        'DEF3
        {IN3{15:0}]
        SLM
//Clear on read register with internal holding register 16 bits at address 'def4
//input signal in4
CLEAR_ON_READ_REG
        16
        'def4
        {in4[15:0]}
//PM counter with shared holding memory 8 bits at address 'def5
//Clears to 8'hfa on hard reset, input signal in5
PM_COUNTER_REG
        8
        'def5
        8'hfa
        {in5}
        SLM
```

-continued

```
//PM counter with shared holding and shadow registers 18 bits at addresses 'def6 & def7
//default clear, input signal in6
PM_COUNTER_REG
    18
    'def6
    'def7
    <>
    {in6}
    {outPM[17:0]}
    SLM
//PM counter with internal holding and shadow registers 18 bits at addresses 'def8 & 'def9
//default clear, input signal in7
PM_COUNTER_REG
    18
    'def8
    'def9
    <>
    {in7}
//Interrupt status register 16 bits, status at address 'def10, mask at address 'def11,
//force address at 'def12, and raw address at 'def13, input signal in8
INTERRUPT_STATUS_REG
    16
    'def10
    'def11
    'def12
    'def13
    {in8[15:0]}
//smart-bit register 16 bits at address 'def14 input signal in9
SMART_BIT_REG
    16
    'def14
{in9[15:0]}
```

Custom Registers

A register block can be defined as a custom register with the CUSTOM_REG keyword. This allows the user to connect a custom RTL module into the top level module. The formats and setup for such custom register blocks are described briefly in more detail below:

Custom Register Format

Beginning A Custom Register Block

All register blocks should begin with a register type definition. The CUSTOM_REG keyword signals to the program that a user wishes to instantiate a custom register. To start a custom register block, the user would place the following line at the beginning of the register block:

CUSTOM_REG

Module_Name

The next line should be the MODULE_NAME keyword. The MODULE_NAME keyword accepts one parameter. This parameter is the module name of the custom RTL module to be instantiated. For example, if the user wishes to use a module called "CUSTOM_MOD" he would need to include the CUSTOM_MOD.v in his project and place the following command in custom register block:

MODULE_NAME=CUSTOM_MOD

Register Size

The next line should contain the size of the register. Even if the RTL module used does not require the size of the register to be passed as a parameter, the script requires this value for some of its error checking routines. If it were desired to have a custom register that was 16 bits wide, the user would simply place the following in the register block indicating size:

16

SIGNAL Keyword

The SIGNAL keyword allows the user to connect one of the basic signal types to any port in the custom RTL module. The format for this command is:

SIGNAL=internal_signal/signal_type wherein internal_signal is a valid verilog port name and signal_type is a valid is one of the following:

| | |
|---|---|
| CLOCK | Internal clock |
| CONTROL ENABLE | Selective write disable |
| RESET | Asynchronous low true reset |
| PROCESSOR_READ_STROBE | Synchronous write strobe |
| PROCESSOR_ADDRESS | Processor address bus |
| PROCESSOR_WRITE_STROBE | Synchronous write strobe |
| PROCESSOR_WRITE DATA | Processor write data bus |

For example, if it were desired to connect a p_address port to the processor address bus, a my_clock port to the system clock, and a reset_n to the system reset signal, the method would include the following lines in the register block:

SIGNAL=p_address/PROCESSOR_ADDRESS
SIGNAL=my_clock/CLOCK
SIGNAL=reset_n/RESET

Output_Signal Keyword

The OUTPUT_SIGNAL keyword is used when it is desired for the register to output data to the asic. Output signals will automatically be passed out of the top level module. The format for this command is OUTPUT_SIGNAL=internal_signal/{output_signal_list}. The internal signal must be a valid verilog port name and the output_signal_list must be a concatenation of one or more valid verilog signal or bus names.

For example, if one wished to output information from the 16 bit ouput port data_out as two 8 bit data signals, the method would call for placing the following line in the custom register block:

OUTPUT_SIGNAL=data_out/{data_out_1[7:0], data_out_2[7:0]}

Input_Signal Keyword

The INPUT_SIGNAL keyword is used when it is desired for the register to read data from the asic. Input signals will automatically be passed in to the top level module. The format for this command is INPUT_SIGNAL=internal_signal/{input_signal_list}. The internal signal must be a valid verilog port name and the input_signal_list must be a concatenation of one or more valid verilog signal or bus names. For example, if it were desired to input information to the 16 bit input port data_in from two 8 bit data signals, the method would call for placing the following line in the custom register block:

INPUT_SIGNAL=data_in/{data_in_1[7:0],data_in_2[7:0]}

Latched_Output Keyword

The LATCHED_OUTPUT keyword is used to connect module ports to the latched part of the read MUX. This is used if the custom module requires latching on the read cycle. The LATCHED_OUTPUT keyword accepts one parameter, the verilog port name to connect to the latched part of the read MUX. For example, if it were desired to connect the read_back port of the custom module to the latched input of the read MUX, the method would call for including the following line in the custom register block:

LATCHED_OUTPUT=read_back

Unlatched_Output Keyword

The UNLATCHED_OUTPUT keyword is used to connect module ports to the unlatched part of the read MUX. This is used if the custom module requires no further latching on the read cycle. The UNLATCHED_OUTPUT keyword accepts one parameter, the verilog portname to connect to the unlatched part of the read MUX. For example, if it were desired to connect the read_back port of the custom module to the unlatched input of the read MUX, the method would call for including the following line in your custom register block:

UNLATCHED_OUTPUT=read_back

Shadow_Output Keyword

The SHADOW_OUTPUT keyword is used to connect module ports to the shared shadow register. This is used if the custom module requires some sort of data storage on the read cycle. The USHADOW_OUTPUT keyword accepts one parameter, the verilog port name to connect to the shared shadow register. For example, if it were desired to connect the read_back_shadow port of the custom module to the shared shadow register, the method would call for including the following line in the custom register block:

SHADOW_OUTPUT=read_back_shadow

Address_List Keyword

The ADDRESS_LIST keyword is used to specify what addresses this register will occupy in the address space. Even if these are hardcoded into the RTL module, the method should still specify the addresses here. The format for ADDRESS_LIST keyword is: ADDRESS_LIST= address_list is a list of valid addresses (as define in section 4.1) separated by commas (","). For example if the custom register used the addresses 'custom_1, 'custom_2, and 'custom_3, the method would call for placing the following line in the control file:

ADDRESS_LIST='custom_1, 'custom_2, 'custom_3

Latched_Address Keyword

The LATCHED_ADDRESS keyword is used to specify what address the read MUX should look for LATCHED_OUTPUT from the register. The LATCHED_ADDRESS keyword requires only one parameter, the address to readback latched data on. This address must be in the format specified in section 4.1. For example, if it were desired to output latched data when the address is 'custom_1, the method would call for placing the following line in the control file:

LATCHED_ADDRESS='custom_1

Unlatched_Address Keyword

The UNLATCHED_ADDRESS keyword is used to specify what address the read MUX should look for UNLATCHED_OUTPUT from the register. The UNLATCHED_ADDRESS keyword requires only one parameter—the address to readback unlatched data on. This address must be in the format specified in section 4.1. For example, if it were desired to output unlatched data when the address is 'custom_2, the method would call for placing the following line in the control file:

UNLATCHED_ADDRESS='custom_2

Shadow_Latch_Address Keyword

The SHADOW_LATCH_ADDRESS keyword is used to specify what address the shared shadow register should latch SHADOW-OUTPUT data on. The SHADOW_LATCH_ADDRESS keyword requires only one parameter, the address to latch the shared shadow register on. This address must be in the format specified in section 4.1 For example, if it is desired to latch the shared shadow register when the address is 'custom_1, the method would call for placing the following line in the control file:

SHADOW_LATCH_ADDRESS='custom_1

Shadow_Read_Address Keyword

The SHADOW_READ_ADDRESS keyword is used to specify what address the shared shadow register should send the latched data to the read MUX. The SHADOW_READ_ADDRESS keyword requires only one parameter, the address to read back latched data on. This address must be in the format specified in section 4.1. For example, if it were desired to read the shared shadow register when the address is 'custom_2, the method would call for placing the following line in the control file:

SHADOW_READ_ADDRESS='custom_2

Clear_Data Keyword

The CLEAR_DATA keyword is used to specify the default value for the register when there is a hard reset. The CLEAR_DATA keyword accepts one parameter, the data to clear the register with, and it must be in the format specified in section 4.3. For example, if it were desired to clear the custom register to the value 16'h0003, the method would call for placing the following line in the custom register block:

CLEAR_DATA=16'h0003

Optional_Parameter Keyword

The OPTIONAL_PARAMETER keyword is used for passing parameters to the custom RTL module that have not been defined otherwise. A user can employ this keyword to pass any sort of values that the module needs to work correctly. The only parameter required is the value to be passed. For instance, if it were desired to pass the value 4'b0101 to some parameter, the method would call for placing the following line in the control file:

OPTIONAL_PARAM=4'b1101

Instantiation of the Custom Module

When generating the parameter list for instantiating the custom register, the script will pass parameters in this order: (1) address bus width, (2) data bus width, (3) register size, (4) address list, (5) clear data, and (6) optional parameters. It is generally necessary that the parameters are declared in this order in the custom RTL module.

Example of Custom Register Block

This is an example of how to define the custom register block for a 16 bit register which has all bits readable and at least some writable.

```
CUSTOM_REG
16
    MODULE_NAME=MIXED_REG_MOD
SIGNAL=my_clock/CLOCK
SIGNAL=control_enable/CONTROL_ENABLE
SIGNAL=reset_n/RESET
SIGNAL=p_address/PROCESSOR_ADDRESS
OUTPUT_SIGNAL=data_to_asic/{output_mixed[15:0]}
INPUT_SIGNAL=data_from_asic/{input_mixed[15:0]}
UNLATCHED_OUTPUT=read_back
ADDRESS_LIST='mixed_reg_1
UNLATCHED_ADDRESS='mixed_reg_1
CLEAR_DATA=16'h0000
//Read mask
OPTIONAL_PARAMETER=16'b1111111111111111
//Write mask
OPTIONAL_PARAMETER=16'b0000000011111111
    This routine would define the following instantiation (assuming an 8
bit address bus and 16 bit data bus and clock named generic_clock)
MIXED_REG MOD #(
    8,// ADDRESS_BUS_WIDTH
    16,//, DATA_BUS_WIDTH
    16,// REG_SIZE
    'mixed_reg_1, //REGISTER ADDRESS
    16'h0000, // CLEAR DATA
    16,b1111111111111111, //OPTIONAL PARAMETER
    16,b1111111111111111 //OPTIONAL PARAMETER
)
CUSTOM_1
(
.my_clock(generic_clock),
.control_enable(control_enable),
.reset_n(reset_n),
.data_from_asic({input_mixed[15:0]})
.data_to_asic({output_mixed[15:0]}),
.read_back(read_to_unlatched_CUSTOM_9_1),
.p_address(processor_address)
);
```

Minimum Information Required for Custom Register

Generally the minimum amount of information that should be specified in order to be able to instantiate a custom register includes: register size, RTL module name, address list, at least one latched or unlatched output port, at least one latched or unlatched read address, and at least one signal must be connected to the processor address signal.

Error Codes

Limitations

Due to the comparatively-primitive nature of the control file format that may be usefully employed in the present invention, some errors may be flagged incorrectly. For example, a misspelled register type keyword can be interpreted as an invalid optional flag if it follows a register that has optional flags. If data is missing within a register block, the script will interpret the next piece of data in its place.

For example, if a user forgets a register size but specifies the address on the first line, the script will complain that the user has specified an invalid register size because it will read the address as if it was the register size. Although the error may not always be correct, the line number will always point to the correct error and it should be easy to correct.

Table of Error Codes

Below is set forth a table of exemplary error codes that may be employed to indicate to the user common errors and suggest to the user the solutions to such errors.

TABLE 3

Error Codes

| Error Code | Causes/Solution |
|---|---|
| 1 | The input file specified cannot be opened for reading. The filename is invalid or the file does not exist. |
| 2 | The standard include file could not be opened, the filename may be invalid, or the file does not exist. |
| 3 | The output file could not be opened, the filename may be invalid, or there is not enough disk space. |
| 101 | You didn't specify all of the necessary information. The MODULE_NAME, ADDRESS_BUS_WIDTH, DATA_BUS_WIDTH, STANDARD_INCLUDE_FILE, and CLOCK_NAME must be specified before the first register block. |
| 102 | There must be at least one register block declared in the control file. |
| 103 | The register type you specified is not valid. Valid register types are: READ_ONLY_REG, READ_WRITE_REG, PM_COUNTER_REG, CLEAR_ON_READ_REG, INTERRUPT_STATUS_REG, SMART_BIT_REG, and CUSTOM_REG |
| 104 | You need to specify a bit width for each register block. The register bit width should be placed on the line directly after the register type declaration. |
| 105 | The register bit width you specified is not in the correct format. The bit width must be in the form of an integer or a in width/base format. |
| 106 | PM counter sizes cannot be greater than two times the data bus width. The value you specified for the register size exceeds this. |
| 107 | Register sizes cannot be greater than the data bus width. The value you specified for the register size exceeds this. |
| 108 | You need to specify a primary address for each register block. The register address should be placed on the line directly following the register bit width. |

TABLE 3-continued

Error Codes

| Error Code | Causes/Solution |
|---|---|
| 109 | The read only register requires a list of input signals. The list of input signal names should be placed on the line directly after the address. |
| 110 | Read/write registers require a reset value. You need to specify a value or use the "<>" token for the default reset operation. The reset value should be placed on the line directly after the primary address. |
| 111 | A pm counter that has a bit width larger than the data bus width needs to have two addresses specified. The second address should be placed on the line directly after the primary address. |
| 112 | PM counter registers require a reset value. You need to specify a value or use the "<>" token for the default reset operation. The reset value should be placed on the line directly after the last address. |
| 113 | PM counter registers require and input signal name. This signal should be placed on the line directly after the reset value. |
| 114 | Interrupt status registers require a mask address. :The mask address should be placed on the line directly following the primary address. |
| 115 | Interrupt status registers require a force address. The force address should be placed on the line directly following the mask address. |
| 116 | Interrupt status registers require a raw address. The raw address should be placed on the line directly following the force address. |
| 117 | Interrupt status register require an input signal list. The input signal list should be placed on the line directly following the raw address. |
| 118 | Smart bit registers require an input signals list. The input signals list should be placed on the line directly following the primary address. |
| 119 | Clear on read registers require and input signals list. The input signals list should be placed on the line directly following the primary address. |
| 120 | The input signals must be the same bit width as the register. You cannot connect output lines to register bits selectively. |
| 121 | PM counters require only a single one bit input line. |
| 122 | The output signals must be the same bit width as the register. You cannot connect output lines to register bits selectively. |
| 123 | A duplicate address was found. Each register must have a unique address defined. |
| 124 | The address you specified was not in the correct format. All addresses must be in the form of a 'define. |
| 125 | The clear data you specified is not in the correct format. Clear data must be in the form of a hardcoded value, 'define, or <> for the default clear behavior. |
| 126 | The input signal you specified is not valid. All input signals must be in the form of a concatenation. |
| 127 | The output signal you specified is not valid. All output signals must be in the from of a concatenation. |
| 128 | The input signal you specified is not a valid verilog signal name. Valid verilog signals begin with either a letter (a–zA–Z) or underscore (_) followed by one or more letters, underscores, or numbers (0–9). |
| 129 | The input signal specified is used more than once. Each input signal needs to be unique. |
| 130 | The signal specified is declared as both an input and output signal. If the output of one register is to drive the input of another register it must be done outside the top-level module. |
| 131 | The input signal is not valid, all buses must have 0 as the least significant index. They must all be in the form bus[n:0]. |
| 132 | The output signal you specified is not a valid verilog signal name. Valid verilog signals begin with either a letter (a–zA–Z) or underscore (_) followed by one or more letters, underscores, or numbers (0–9). |
| 133 | The output signal specified is used more than once. Each output signal needs to be unique. |
| 134 | The output signal is not valid, all buses must have 0 as the least significant index. They must all be in the form bus [n:0]. |
| 135 | The optional flag you specified is invalid. Valid optional parameters for read/write registers are: an ouput signal list. |
| 136 | The optional flag you specified is invalid. Valid optional parameters for pm counter registers are: an output signal list, or the SLM flag. |
| 137 | The optional flag you specified is invalid. Valid optional parameters for interrupt status registers are: the LWCE flag. |
| 138 | The optional flag you specified is invalid. Valid optional parameters for clear on read registers are: the SLM flag. |

TABLE 3-continued

Error Codes

| Error Code | Causes/Solution |
|---|---|
| 139 | The key you specified is not a valid option for a custom register. Valid keys are: MODULE_NAME, SIGNAL, OUTPUT_SIGNAL, INPUT_SIGNAL, LATCHED_OUTPUT, UNLATCHED_OUTPUT, SHADOW_OUTPUT, ADDRESS_LIST, LATCHED_ADDRESS, UNLATCHED_ADDRESS, SHADOW_LATCH_ADDRESS, SHADOW_READ_ADDRESS, CLEAR_DATA, and OPTIONAL_PARAMETER. For more information on this subject see the Custom Register section in this document. |
| 140 | The signal specified is not a valid verilog signal name. The SIGNAL key requires that you specify a valid verilog signal as the first argument. |
| 141 | The signal type specified is invalid. The SIGNAL key requires that you specify a valid signal type as the second argument. Valid signal types are: CLOCK, CONTROL_ENABLE, RESET, PROCESSOR_EAD_STROBE, PROCESSOR_ADDRESS, PROCESSOR_WRITE_STROBE, PROCESSOR_WRITE_DATA. |
| 142 | This signal name specified is not a valid verilog signal. The OUTPUT_SIGNAL key requires a valid verilog signal as the first parameter. |
| 143 | This signal name specified is not a valid verilog signal. The INPUT_SIGNAL key requires a valid verilog signal as the first parameter. |
| 144 | This signal name specified is not a valid verilog signal. The LATCHED_OUTPUT key requires a valid verilog signal as the first parameter. |
| 145 | This signal name specified is not a valid verilog signal. The UNLATCHED_OUTPUT key requires a valid verilog signal as the first parameter. |
| 146 | This signal name specified is not a valid verilog signal. The INTERRUPT_OUTPUT key requires a valid verilog signal as the first parameter. |
| 147 | This signal name specified is not a valid verilog signal. The SHADOW_OUTPUT key requires a valid verilog signal as the first parameter. |
| 148 | You have entered an invalid key/tag combination. Please refer to the Custom Register section of this document for more information. |
| 149 | You did not specify all the information necessary to instantiate a custom register. Please refer to the Custom Register section of this document for more information. |
| 150 | You have used the ADDRESS_LIST keyword more than once. You may only specify one address list for each custom register. |
| 151 | You have used the MODULE_NAME keyword more than once. You may only specify one RTL module name for each custom register. |
| 152 | You have used the PROCESSOR_ADDRESS signal more than once. You may only connect this signal to one port in the custom register. |
| 201 | The address 'define you specified does not match the address bus width. Addresses must be defined with the correct bit width in the standard include file. |
| 202 | An address 'define you specified in the control file does not exist in the standard include file. |
| 203 | The clear data you specified is invalid. The bit width of the clear data must match the register bit width. |
| 204 | The clear data you specified with a 'define in the control file does not exist in the standard include file. All 'defines used for clear data in the control file, must be defined in the standard include file. |

The present invention has been discussed hereinabove in conjunction with a user. It will be understood that the user may be any operator or plurality of operators responsible for initiating and monitoring the automated register instantiation processor. The user will most typically use the present invention in conjunction with a computerized system having conventional input/output devices, wherein the system is adapted and programmed for implementing the algorithms and modules set forth herein, for directing register setting as is known in the art. The methods described herein have been set forth in exemplary form but could be embodied (using RTL or similar text-based programming) across a variety of commonly-used workstation environments or other computer systems commonly employed in an IC design and fabrication setting. For instance, although all the embodiments described herein involve creation of a control file (subsequently compiled by a compiler), formed using the defined programming language based on the keywords related to respective registers, the present invention can be and has been adapted in alternative embodiments omitting the control file and creating synthesizable codes without the use of the intermediate control file.

It will be recognized that the present invention is not limited to a particular hardware or software environment, nor to particular forms of ICs, but may be broadly adapted across a variety of systems for instantiation of registers in substantially any IC or IC device containing such registers.

While the present invention has been described in the foregoing exemplary descriptions in conjunction with the processing steps or modules, the present invention also includes systems and apparatuses for register instantiation, as long as such systems and apparatuses are adapted for the instantiation steps described herein, or act under the direction of computer systems implementing the modules and steps described herein. It will be evident that a computer processing system programmed to execute the steps set forth herein can be repeatably used in a fabrication process for batch instantiation of multiple consecutive batches of ICs. In such an embodiment, it is necessary to provide an interface for required transmission of instantiation-related signals to an integrated circuit/chip or a large plurality of such chips. Such interfaces are conventionally known in the art for testing and instantiation of IC chips.

It will further be understood that while this invention has been described in conjunction with certain exemplary embodiments, the invention's utility is not limited thereto. Thus, those of ordinary skill in the art will understand that the embodiments and examples set forth herein are illustrative only, and not intended to delimit or constrain the spirit and scope of the present invention, which are limited only by the claims that follow.

We claim as our invention:

1. An automated method for instantiation of a plurality of registers within an integrated circuit, comprising the steps of:
   (a) defining a programming language having a plurality of keywords identified with the plurality of registers within the integrated circuit;
   (b) creating a control file describing the plurality of registers using said defined programming language;
   (c) providing a compiling program compatible with said control file; and
   (d) executing said compiling program to generate from said control file a first set of synthesizable codes containing information regarding each of the plurality of registers, wherein the synthesizable codes are executable to instantiate one or more corresponding registers within the integrated circuit.

2. The method of claim 1, wherein said set of synthesizable codes comprises extensible programming language codes.

3. The method of claim 1, further comprising the step of:
   (e) executing said compiling program to generate an address decoder module operative in conjunction with said first set of synthesizable codes through a top-level module for instantiation of:
      (i) said address decoder module; and
      (ii) the plurality of registers.

4. The method of claim 3, wherein said set of synthesizable codes comprises extensible programming language codes.

5. The method of claim 2 or 4, wherein said extensible programming language comprises Register Transfer Language.

6. The method of claim 2 or 4, wherein said method is applied at least in part for instantiation of custom registers.

7. The method of claim 6, wherein said extensible programming language comprises Register Transfer Language.

8. The method of claim 2 or 4, wherein said method is implemented in part on a computer processing system capable of processing text files.

9. The method of claim 8, wherein said extensible programming language comprises Register Transfer Language.

10. A system for automated instantiation of a plurality of registers within an integrated circuit, comprising:
    (a) a computer processor;
    (b) input and output devices for a user operating said processor;
    (c) a memory linked to said processor;
    (d) a plurality of algorithm modules programmed into said memory, said modules operative for:
       (i) defining a programming language having a plurality of keywords identified with the plurality of registers within the integrated circuit;
       (ii) creating a control file describing the plurality of registers using said defined programming language;
       (iii) providing a compiling program compatible with said control file; and
       (iv) executing said compiling program to generate from said control file a first set of synthesizable codes containing information regarding each of the plurality of registers, wherein the synthesizable codes are executable to instantiate one or more corresponding registers within the integrated circuit.

11. The system of claim 10, further comprising:
    (e) at least one electronic interface for transmission of instantiation-related signals from said system to the integrated circuit.

12. The system of claim 11, wherein said set of synthesizable codes comprises extensible programming language codes.

13. The system of claim 11, further comprising an algorithm module for:
    (v) executing said compiling program to generate an address decoder module operative in conjunction with said first set of synthesizable codes through a top-level module for instantiation of:
       (A) said address decoder module; and
       (B) the plurality of registers.

14. The system of claim 13, wherein said set of synthesizable codes comprises extensible programming language codes.

15. The method of claim 12 or 14, wherein said extensible programming language comprises Register Transfer Language.

16. The system of claim 12 or 14, wherein said system is operative at least in part for instantiation of custom registers.

17. The method of claim 16, wherein said extensible programming language comprises Register Transfer Language.

18. The system of claim 12 or 14, wherein said computer processor comprises a processing system capable of processing text files.

19. The system of claim 18, wherein said extensible programming language comprises Register Transfer Language.

20. Software embodied in a computer-readable medium operable to perform the steps of:
    defining a programming language having a plurality of keywords identified with the plurality of registers within the integrated circuit;
    creating a control file describing the plurality of registers using said defined programming language;
    providing a compiling program compatible with said control file; and
    executing said compiling program to generate from said control file a first set of synthesizable codes containing information regarding each of the plurality of registers, wherein the synthesizable codes are executable to instantiate one or more corresponding registers within the integrated circuit.

21. The software of claim 20, further operable to perform the step of executing said compiling program to generate an address decoder module operative in conjunction with said first set of synthesizable codes through a top-level module for instantiation of:

(i) said address decoder module; and (ii) the plurality of registers.

22. The software of claims 20, wherein said set of synthesizable codes comprises extensible programming language codes.

23. The software of claims 22, wherein said extensible programming language comprises Register Transfer Language.

24. A system, comprising:

means for defining a programming language having a plurality of keywords identified with the plurality of registers within the integrated circuit;

means for creating a control file describing the plurality of registers using said defined programming language;

means for providing a compiling program compatible with said control file; and means for executing said compiling program to generate from said control file a first set of synthesizable codes containing information regarding each of the plurality of registers, wherein the synthesizable codes are executable to instantiate one or more corresponding registers within the integrated circuit.

25. The system of claim 24, further comprising means for executing said compiling program to generate an address decoder module operative in conjunction with said first set of synthesizable codes through a top-level module for instantiation of:

(i) said address decoder module; and (ii) the plurality of registers.

* * * * *

UNITED STATES PATENT AND TRADEMARK OFFICE
CERTIFICATE OF CORRECTION

PATENT NO. : 6,721,937 B2
DATED : April 13, 2004
INVENTOR(S) : Chard et al.

It is certified that error appears in the above-identified patent and that said Letters Patent is hereby corrected as shown below:

<u>Title page,</u>
Item [57], ABSTRACT,
Line 15, delete "n", and insert -- in --.

<u>Column 2,</u>
Line 43, delete "n", and insert -- in --.

<u>Column 6,</u>
Line 35, delete "CREATED", and insert -- Created --.
Line 55, delete "(1<counter width<2xdata bus width)", and insert -- (1< counter width ≤2xdata bus width) --.

<u>Column 7,</u>
Line 26, delete "Read_Only_Reg", and insert -- READ_ONLY_REG --.

<u>Column 8,</u>
Line 1, delete "Read_ Write_ Reg", and insert -- READ_WRITE_REG --.
Line 5, delete "PM_Counter_Reg", and insert -- PM_COUNTER_REG --.
Line 11, delete "PM_Counter_Reg", and insert -- PM_COUNTER_REG --.
Line 17, delete "Interrupt_Status_Mask_Force_Reg" and insert
-- INTERRUPT_STATUS_MASK FORCE_REG --.

<u>Column 9,</u>
line 14, delete "Smart_Bit_Reg", and I insert -- SMART_BIT_REG --.

<u>Column 10,</u>
Line 21, delete "Clear_On_Read_Reg", and insert -- CLEAR_ON_READ_REG --.
Line 25, delete "Clear_On_Read_Reg", and insert -- CLEAR_ON_READ_REG --.
Line 35, delete ="whatever you_want_to_call_ your_clock", and insert
-- WHATEVER_YOU_WANT_TO_CALL_YOUR_CLOCK --.

<u>Column 14,</u>
Line 54, delete "Output_Signal", and insert -- OUTPUT_SIGNAL --.

UNITED STATES PATENT AND TRADEMARK OFFICE
CERTIFICATE OF CORRECTION

PATENT NO.     : 6,721,937 B2
DATED          : April 13, 2004
INVENTOR(S)    : Chard et al.

It is certified that error appears in the above-identified patent and that said Letters Patent is hereby corrected as shown below:

Column 15,
Line 1, delete "Input_Signal", and insert -- INPUT_SIGNAL --.
Line 15, delete "Latched_Output", and insert -- LATCHED_SIGNAL --.
Line 26, delete "Unlatched Output", and insert -- UNLATCHED_ OUTPUT --.
Line 39, delete "Shadow_Output", and insert -- SHADOW_OUTPUT --.
Line 43, delete "USHADOW", and insert -- SHADOW --.
Line 50, delete "Address_List", and insert -- ADDRESS_LIST --.
Line 62, delete "Latched_Address" and insert -- LATCHED_ ADDRESS --.

Column 16,
Line 6, delete "Unlatched_Address", and insert -- UNLATCHED_ ADDRESS --.
Line 17, delete "Shadow_Latch_ Address", and insert
-- SHADOW_LATCH_ADDRESS --.
Line 23, after "4.1", insert -- . --.
Line 28, delete "Shadow_Read_Address" and insert
-- SHADOW_READ_ADDRESS --.
Line 40, delete "Clear_Data", insert -- CLEAR_DATA --.
Line 51, delete "Optional_Parameter", and insert -- OPTIONAL_PARAMETER --.
Line 60, delete "1101", and insert -- 0101 --.

Column 17,
Line 24, delete "REG MOD", and insert -- REG_MOD --.

Column 19,
111, delete "pm", and insert -- PM --.
113, delete "and", and insert -- an --.
114, after ".", delete ":".
117, delete "register", and insert -- registers --.
119, delete "and", and insert -- an --.
127, delete "from", and insert -- form --.
135, delete "ouput", and insert -- output --.
136, delete "pm", and insert -- PM --.

UNITED STATES PATENT AND TRADEMARK OFFICE
CERTIFICATE OF CORRECTION

PATENT NO. : 6,721,937 B2
DATED : April 13, 2004
INVENTOR(S) : Chard et al.

It is certified that error appears in the above-identified patent and that said Letters Patent is hereby corrected as shown below:

Column 25,
Line 12, delete "claims", and insert -- claim --.
Line 15, delete "claims", and insert -- claim --.

Signed and Sealed this

Twenty-first Day of December, 2004

JON W. DUDAS
*Director of the United States Patent and Trademark Office*